(12) United States Patent
Ku

(10) Patent No.: US 7,940,074 B2
(45) Date of Patent: May 10, 2011

(54) DATA TRANSMISSION CIRCUIT AND SEMICONDUCTOR APPARATUS INCLUDING THE SAME

(75) Inventor: Young Jun Ku, Ichon-si (KR)

(73) Assignee: Hynix Semiconductor Inc., Ichon-si (KR)

( * ) Notice: Subject to any disclaimer, the term of this patent is extended or adjusted under 35 U.S.C. 154(b) by 0 days.

(21) Appl. No.: 12/650,433

(22) Filed: Dec. 30, 2009

(65) Prior Publication Data

US 2011/0074460 A1    Mar. 31, 2011

(30) Foreign Application Priority Data

Sep. 30, 2009    (KR) .................. 10-2009-0093575

(51) Int. Cl.
*H03K 19/0175*    (2006.01)
*H03K 19/094*    (2006.01)
*H03K 19/003*    (2006.01)

(52) U.S. Cl. .......................................... 326/21; 326/86

(58) Field of Classification Search .................... 326/21, 326/27, 30, 82, 83, 86; 327/108
See application file for complete search history.

(56) References Cited

U.S. PATENT DOCUMENTS

| 7,111,149 | B2 | 9/2006 | Eilert |
| 7,513,310 | B2 | 4/2009 | Fossli |
| 7,564,123 | B1 | 7/2009 | Wang et al. |
| 7,598,617 | B2 | 10/2009 | Lee et al. |
| 2003/0080774 | A1* | 5/2003 | Funaba ........................ 326/30 |
| 2009/0091962 | A1 | 4/2009 | Chung et al. |
| 2009/0237970 | A1 | 9/2009 | Chung |
| 2010/0047966 | A1* | 2/2010 | Silvestri ...................... 438/109 |

FOREIGN PATENT DOCUMENTS

KR    10-0806465    2/2008

\* cited by examiner

*Primary Examiner* — Daniel D Chang
(74) *Attorney, Agent, or Firm* — Echelon Law Group, PC

(57) ABSTRACT

A data transmission circuit includes a data transmission unit and a data receiving unit. The data transmission unit generates transmission data based on first chip data and transmit the transmission data via a Through Silicon Via (TSV). The data receiving unit differentially amplifies the transmission data with respect to a reference voltage to generate second chip data.

18 Claims, 5 Drawing Sheets

DATA TRANSMISSION CIRCUIT AND SEMICONDUCTOR APPARATUS INCLUDING THE SAME

CROSS-REFERENCE TO RELATED APPLICATION

The present application claims priority under 35 U.S.C §119(a) to Korean Application No. 10-2009-0093575, filed on Sep. 30, 2009, which is incorporated by reference in its entirety as if set forth in full.

BACKGROUND OF THE INVENTION

1. Technical Field

Various embodiments of the present disclosure generally relate to a semiconductor apparatus, and more particularly, to a data input/output circuit of a three-dimensional (3D) package semiconductor apparatus.

2. Related Art

As electronic devices are pursuing higher performance, higher capacity and smaller size, constituent semiconductor apparatuses have generally become smaller in size while providing enhanced functionality. In order to reduce the size of the semiconductor apparatus, it is required to increase the capacity of a unit package. Therefore, techniques to increase the capacity of the semiconductor apparatus by incorporating a plurality of chips into a single package have been proposed. In addition, researches are actively being conducted on a three-dimensional (3D) package semiconductor apparatus having a through silicon via (TSV) structure, in which a via penetrates and electrically connects a plurality of stacked chips.

A typical 3D package semiconductor apparatus can be designed such that, of the plurality of chips electrically connected via the TSV, one chip is designated as a master chip and the other chip (or chips) are designated as a slave chip, wherein data transmitted from the master chip can be transmitted to the respective slave chips via the TSV and data transmitted from the respective slave chips can be transmitted to the master chip via the TSV.

FIG. 1 is a diagram schematically showing a configuration of a data transmission circuit of the semiconductor apparatus according to the related art. As shown in FIG. 1, the semiconductor apparatus according to the related art can comprise a master chip 10 and a slave chip 20, both of which are electrically connected with each other via a TSV 30. The master chip 10 comprises a master transmission unit 11 and a master receiving unit 12, and correspondingly, the slave chip 20 comprises a slave transmission unit 21 and a slave receiving unit 22. Data inputted to the master chip 10 can be amplified by the master transmission unit 11, and the amplified data can be transmitted to the slave receiving unit 22 via the TSV 30. On the other hand, data stored in the slave chip 20 can be amplified by the slave transmission unit 21, and the amplified data can be transmitted to the master receiving unit 12 via the TSV 30.

FIG. 2 is a diagram showing a configuration of the master transmission unit 11 in FIG. 1 according to the related art. As shown in FIG. 1, the master transmission unit 11 comprises a first NAND gate ND1, a first inverter IV1, a first NOR gate NOR1, and a driver. The first NAND gate ND1 receives a strobe signal IOSTB and master chip data GIO_M. The first NAND gate ND1 outputs a logic low signal if the strobe signal IOSTB is enabled at a logic high level and the master chip data GIO_M is at a logic high level. The first inverter IV1 inverts the strobe signal IOSTB. The first NOR gate NOR1 receives an output signal of the first inverter IV1 and the master chip data GIO_M. Therefore the first NOR gate NOR1 outputs a logic high signal if the strobe signal IOSTB is enabled at a logic high level and the master chip data GIO_M is at a logic low level.

The driver comprises a first p-type metal oxide semiconductor (PMOS) transistor P1 and a first n-type metal oxide semiconductor (NMOS) transistor N1, and generates transmission data GIO_TSV of a logic high level if an output signal of the first NAND gate ND1 is at a logic low level, and generates the transmission data GIO_TSV of a logic low level if an output signal of the first NOR gate NOR1 is at a logic high level.

FIG. 3 is a diagram showing a configuration of the slave receiving unit 22 in FIG. 1 according to the related art. As shown in FIG. 3, the slave receiving unit 22 comprises a second NAND gate ND2, a second inverter IV2 a second NOR gate NOR2, and a driver. If the strobe signal IOSTB is enabled to a logic high level, the slave receiving unit 22 re-amplifies the transmission data GIO_TSV transmitted via the TSV 30 to transmit the amplified data as a slave chip data GIO_S.

Although the semiconductor apparatus shown in FIG. 1 has two stacked chips, three or more chips, in general, are stacked to constitute a single semiconductor apparatus having the TSV structure. Therefore, in general, the TSV 30 transmitting the transmission data GIO_TSV has a very large capacitance. That is, in order to receive the transmission data GIO_TSV, the slave chip has to comprise a receiving unit, e.g., the slave receiving unit 22, and thus, as the number of stacked chips is increased, the number of slave receiving units is also increased, and the capacitance that the master transmission unit 11 faces is also increased. In the state where the capacitance is increased, if a logic level of the transmission data GIO_TSV transmitted via the TSV 30 transitions to its opposite logic level, the transition speed is inevitably decreased. For example, if the master chip data GIO_M changes from a logic low level to a logic high level the transmission data GIO_TSV transits to a logic high level very slowly due to the large capacitance of the TSV 30. Therefore, since the slave receiving unit 22 receiving the transmission data GIO_TSV should wait until the transmission data GIO_TSV transits and perform the sense amplification operation at a relatively late point of time, it is difficult for the slave receiving unit 22 to generate the slave chip data accurately. In addition, since the capacitance of the TSV 30 is very large, the time period necessary to drive the transmission data GIO_TSV is increased, and therefore current consumption is also increased.

SUMMARY OF THE INVENTION

Various aspects of the present invention comprise a data transmission circuit, capable of using a sense amplification technique and substantially reducing a swing width of data transmitted via a TSV, and a semiconductor apparatus comprising the same.

In one aspect of the present invention, a data transmission circuit comprises: a data transmission unit configured to generate transmission data based on first chip data and transmit the transmission data via a through silicon via (TSV); and a data receiving unit configured to differentially amplify the transmission data with respect to a reference voltage and generate second chip data.

In another aspect of the present invention, a data transmission circuit of a semiconductor apparatus comprises: a pulse generating unit configured to receive a strobe signal and generate a strobe pulse, wherein the strobe pulse has a narrower pulse width than that of the strobe signal; a data transmission unit disposed in a first chip and configured to generate transmission data based on first chip data during an enable interval of the strobe pulse and transmit the transmission data via a through silicon via (TSV), wherein the transmission data swings between an external voltage level and a first voltage level; and a data receiving unit disposed in a second chip and configured to differentially amplify the transmission data with respect to the reference voltage and generate second chip data.

In still another aspect of the present invention, a semiconductor apparatus having a master chip and a plurality of slave chips which are stacked and electrically connected with each other via a through silicon via (TSV). The semiconductor apparatus comprises: a first data transmission circuit configured to receive master chip data via the TSV and differentially amplify the received data with respect to a reference voltage and generate slave chip data; and a second data transmission circuit configured to receive the slave chip data via the TSV and differentially amplify the slave chip data received with respect to the reference voltage to generate the master chip data.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Figure 1:
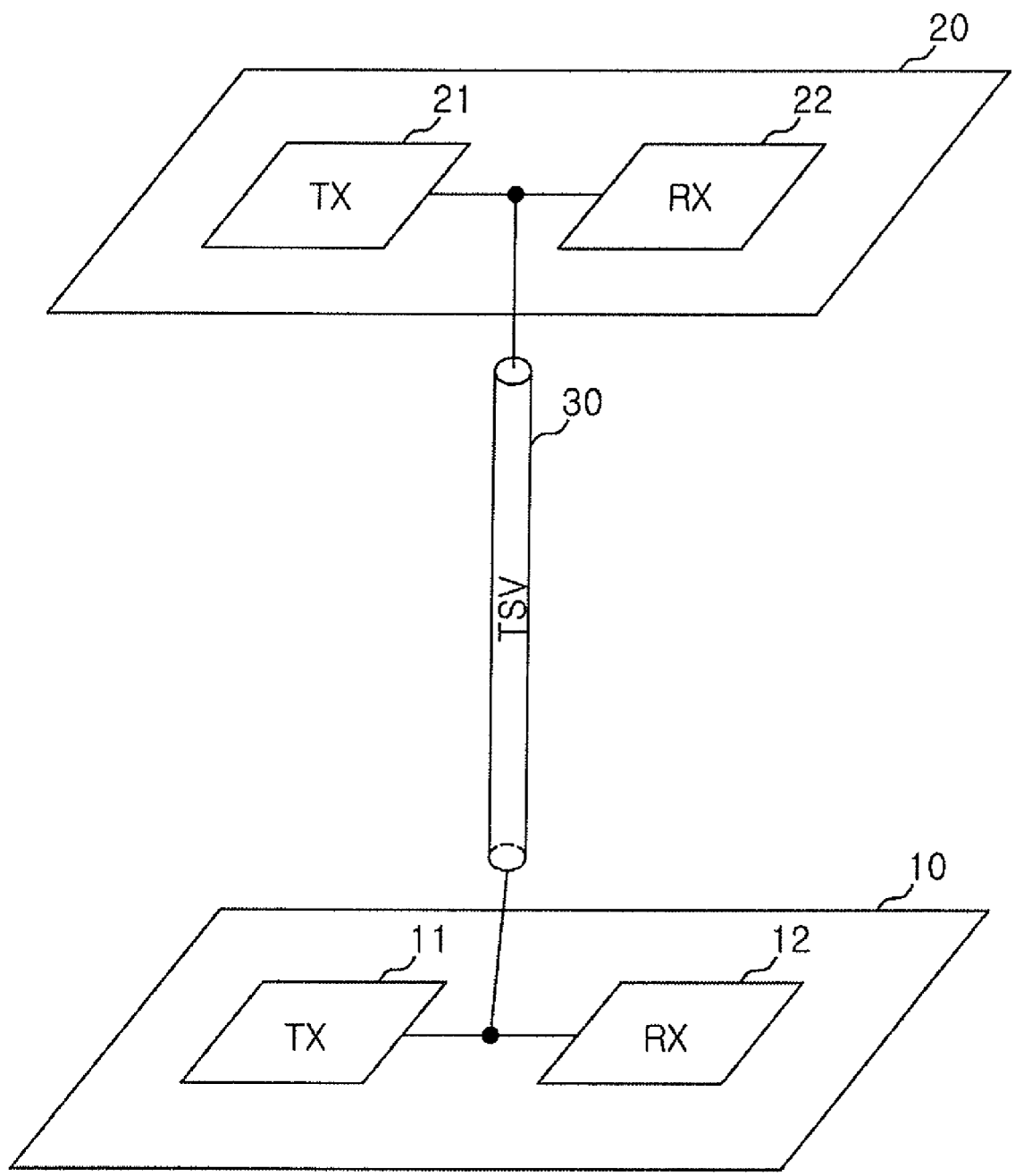
FIG. 1 is a diagram schematically showing a configuration of a typical data transmission circuit of a semiconductor apparatus.
Figure 2:
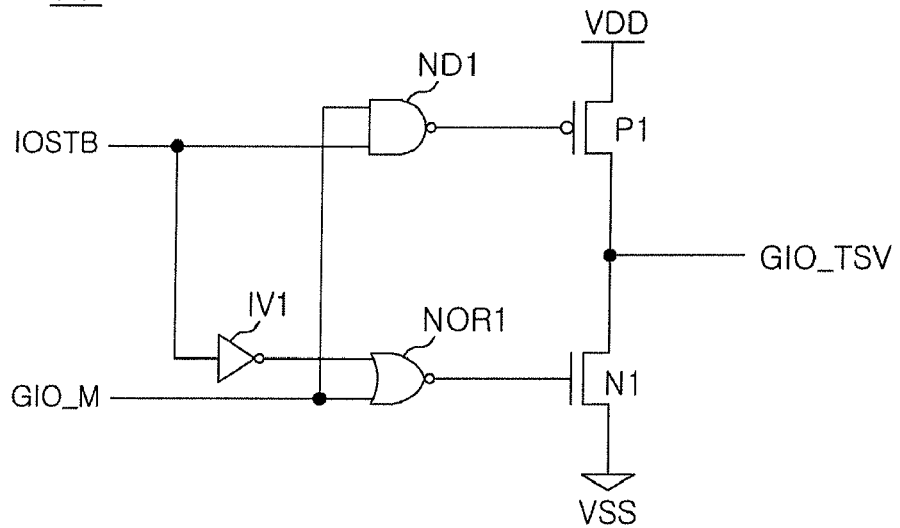
FIG. 2 is a diagram showing a configuration of a typical master transmission unit in FIG. 1.
Figure 3:
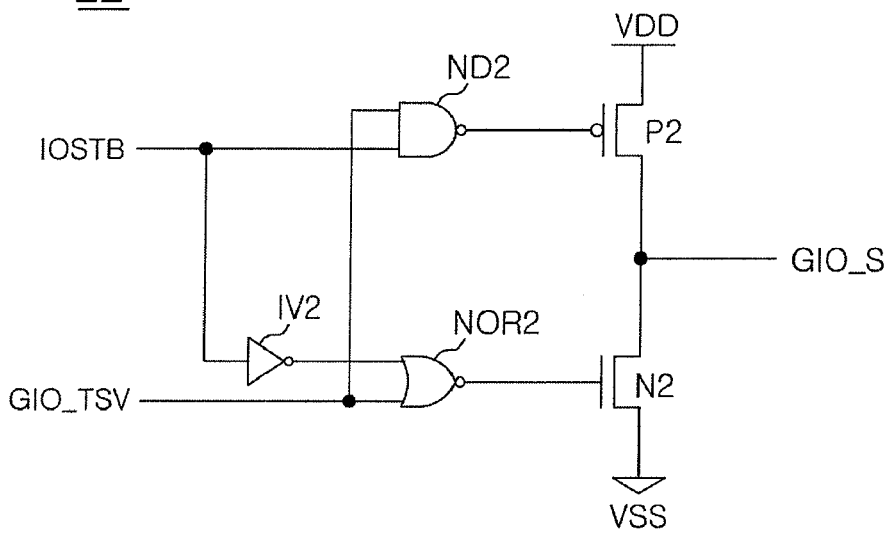
FIG. 3 is a diagram showing a configuration of a typical slave receiving unit in FIG. 1.

Advantages and characteristics of the present invention and a method for achieving them will be apparent with reference to embodiments described below with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 4:
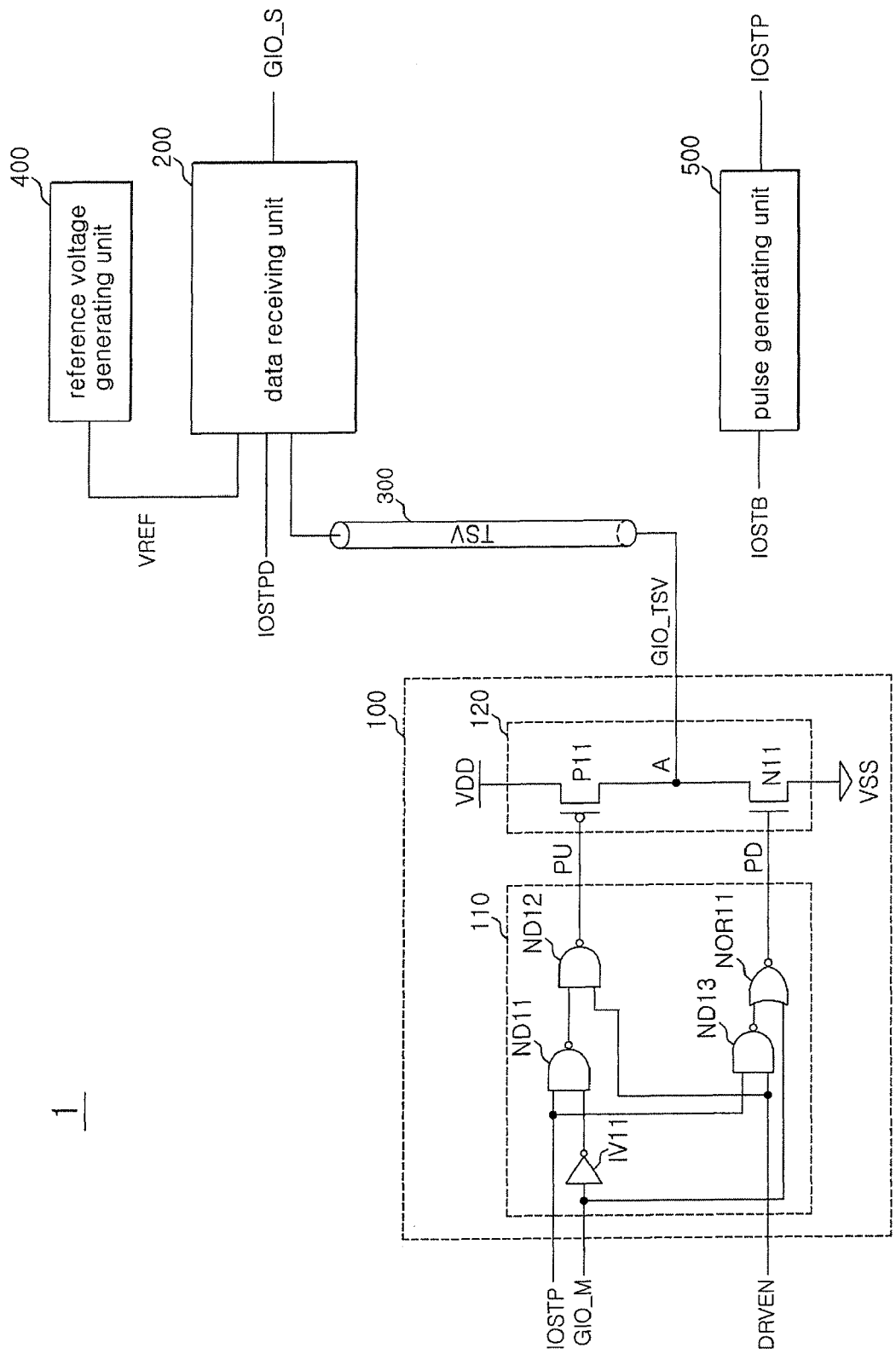
FIG. 4 is a diagram showing a configuration of a data transmission circuit according to one embodiment of the invention.

FIG. 4 is a diagram showing a configuration of a data transmission circuit according to one embodiment of the present invention. As shown in FIG. 4, the data transmission circuit 1 comprises a data transmission unit 100, a data receiving unit 200 and a through silicon via (TSV) 300. The data transmission unit 100 generates transmission data GIO_TSV based on first chip data GIO_M. The TSV 300 functions as a transmission path to transmit the transmission data GIO_TSV. The data receiving unit 200 differentially amplifies the transmission data GIO_TSV received via the TSV 300 with respect to a reference voltage VREF to generate a second chip data GIO_S. The reference voltage VREF level can be set to be below an external voltage (VDD) level by a predetermined value. More specifically, the reference voltage VREF level may be set to a level which is low enough for the data receiving unit 200 to detect the level difference between the external voltage VDD and the reference voltage VREF. The level of the reference voltage VREF can be set to an arbitrary value with consideration of an operation speed of the semiconductor apparatus, process, voltage and temperature (PVT) variations, etc. The data transmission circuit 1 can further comprise a reference voltage generating unit 400 configured to generate the reference voltage VREF.

The data transmission unit 100 generates the transmission data GIO_TSV that swings between the external voltage (VDD) level and a first voltage level (i.e., V1 in FIG. 6), based on the first chip data GIO_M. More specifically, according to one embodiment of the present invention, the data transmission unit 100 generates the transmission data GIO_TSV of the external voltage VDD level if the first chip data GIO_M is at a logic high level, and generates the transmission data GIO_TSV of the first voltage (V1) level if the first chip data GIO_M is at a logic low level. The first voltage V1 level is preferably set to be below the reference voltage VREF level and above a ground voltage (VSS) level. The first voltage V1 level is preferably set to a level which is low enough for the data receiving unit 200 to detect the level difference between the reference voltage VREF and the first voltage V1.

In FIG. 4, the data transmission unit 100 may receive an enable signal DRVEN, a strobe pulse IOSTP and the first chip data GIO_M to generate the transmission data GIO_TSV. The enable signal DRVEN is preferably a signal that substantially maintains an enable state during a read/write operation of the semiconductor apparatus, and for example, can be implemented using a driver enable signal.

The data transmission circuit 1 further comprises a pulse generating unit 500 configured to receive a strobe signal IOSTB to generate the strobe pulse IOSTP. The strobe signal IOSTB may be defined as a pulse signal generated in response to a read command and a write command which are applied from the outside of the semiconductor apparatus. Therefore, at the time when a strobe signal IOSTB is enabled, all of the circuits included in the semiconductor apparatus and associated with the read/write operation are enabled and perform the read/write operation. The pulse generating unit 500 receives the strobe signal IOSTB to generate the strobe pulse IOSTP having a narrower pulse width than that of the strobe signal IOSTB. In the related art, the data transmission circuit drives the transmission data GIO_TSV during an enable interval of the strobe signal IOSTB based on the first chip data GIO_M. Therefore, in the related art, when the first chip data GIO_M changes either from a logic high level to a logic low level or vice versa, the current consumption is inevitably increased to sufficiently drive the transmission data GIO_TSV. However, the data transmission circuit 1 according to the embodiment of the present invention drives the transmission data GIO_TSV during an enable interval of the strobe pulse IOSTP by using the strobe pulse IOSTP having the narrower pulse width than that of the strobe signal IOSTB.

That is, since the data transmission circuit 1 according to this embodiment of the invention does not fully swing the transmission data GIO_TSV between the external voltage VDD level and the ground voltage VSS level, it is sufficient to pull down the transmission data GIO_TSV to the first voltage V1 level if the first chip data GIO_M is at a logic low level. By using the strobe pulse IOSTP having the narrower pulse width than that of the strobe signal IOSTB, the transmission data GIO_TSV can swing between the external voltage VDD level and the first voltage V1 level, and thus the first voltage V1 level is closely related to the strobe pulse IOSTP. As such, since the data transmission circuit 1 drives the transmission data GIO_TSV during the enable interval of the strobe pulse IOSTP having the narrower pulse width than that of the strobe signal IOSTB, the current consumption can be substantially reduced. It is to be understood that the pulse generating unit 500 may be alternatively implemented in the data transmission unit 100.

The data transmission unit 100 preferably substantially upholds the transmission data GIO_TSV to a logic high level if the enable signal DRVEN is enabled before the strobe pulse IOSTP is inputted. The data transmission unit 100 is preferably configured such that, if the first chip data GIO_M is at a logic high level, the transmission data GIO_TSV substantially maintains its logic high level even if the strobe pulse IOSTP is generated, and on the other hand, if the first chip data GIO_M is at a logic low level when the strobe pulse IOSTP is generated, the data transmission unit 100 drives the transmission data GIO_TSV to the first voltage V1 level.

As shown in FIG. 4, the data transmission unit 100 may comprise a control unit 110 and a driver 120. The control unit 110 receives the enable signal DRVEN, the strobe pulse IOSTP and the first chip data GIO_M to generate a pull-up signal PU and a pull-down signal PD.

The control unit 110 comprises a first inverter IV11, a first NAND gate ND11, a second NAND gate ND12, a third NAND gate ND13, and a first NOR gate NOR11. The first inverter IV11 inverts the first chip data GIO_M. The first NAND gate ND11 receives the strobe pulse IOSTP and an output signal of the first inverter IV11. The second NAND gate ND12 receives the enable signal DRVEN and an output signal of the first NAND gate ND11 to output the pull-up signal PU. The third NAND gate ND13 receives the strobe pulse IOSTP and the enable signal DRVEN. The first NOR gate NOR11 receives an output signal of the third NAND gate D13 and the first chip data GIO_M to output the pull-down signal PD.

The driver 120 generates the transmission data GIO_TSV in response to the pull-up and pull-down signals PU and PD. The driver 120 comprises a first PMOS transistor P11 and a first NMOS transistor N11. The first PMOS transistor P11 has a gate to which the pull-up signal PU is applied, a source to which the external voltage VDD is applied, and a drain coupled to a first node A. The first NMOS transistor N11 has a gate to which the pull-down signal PD is applied, a source coupled to the ground voltage VSS, and a drain coupled to the first node A. The transmission data GIO_TSV is generated from the first node A of the driver 120. Such a configuration of the control unit 110 and the driver 120 is by way of example only, and the embodiment shown is not intended to be limiting thereto. That is, all of the logic configurations that operate in substantially the same manner as the control unit 110 and the driver 120, which are described hereinafter, can be employed as the control unit 110 and the driver 120.

The control unit 110 and the driver 120 operate as follows. The control unit 110 generates the pull-up signal PU of a logic low level if the enable signal DRVEN is enabled before the strobe signal IOSTB is generated. The first PMOS transistor P11 is turned on and drives the first node A to the external voltage VDD level. If the strobe pulse IOSTP is generated and the first chip data GIO_M is at a logic high level, the second NAND gate ND12 outputs the pull-up signal PU of a logic low level and the first NOR gate NOR11 outputs the pull-down signal PD of a logic low level. Therefore, since, in the driver 120, the first PMOS transistor P11 is turned on and the first NMOS transistor N11 is turned off, the first node A is driven to a logic high level. On the other hand, if the strobe pulse IOSTP is enabled and the first chip data GIO_M is at a logic low level, the second NAND gate ND12 outputs the pull-up signal PU of a logic high level and the first NOR gate NOR11 outputs the pull-down signal PD of a logic high level. Therefore, since the first PMOS transistor P11 is turned off and the first NMOS transistor N11 is turned on, the first node A is pulled down to the ground voltage VSS level. At this time, it is unnecessary to pull down the first node A to the ground voltage VSS level; rather, it is sufficient to pull down the first node A to the first voltage V1 level. Therefore, data can be successfully transmitted even if the pulse width of the strobe pulse IOSTP is narrower than that of the strobe signal IOSTB used in the related art. Consequently, according to one embodiment of the invention, the data transmission speed of the semiconductor apparatus can be improved and the current consumption thereof can be substantially reduced.

The transmission data GIO_TSV is inputted to the data receiving unit 200 via the TSV 300. The data receiving unit 200 senses and amplifies a level difference between the transmission data GIO_TSV and the reference voltage VREF to generate the second chip data GIO_S. The data receiving unit 200 can be implemented with a typical differential amplifier. In general, the typical differential amplifier needs two input lines. Specifically, the typical differential amplifier used for a data receiving operation preferably uses both a true data line and a false data line. If the data receiving unit is implemented with a typical differential amplifier, the number of data lines is inevitably increased, thereby causing the number of TSVs required to transmit the transmission data GIO_TSV between the plurality of chips to increase. Therefore, in the related art, it is difficult for the 3D package semiconductor apparatus to employ the data receiving unit that uses the typical differential amplifier, because the increase in the number of TSVs can be an obstacle to ensuring lay-out margin of the 3D package semiconductor apparatus. However, according to the embodiment of the invention, since a sense amplifier contained in the data receiving unit 200 senses and amplifies the transmission data GIO_TSV by using the reference voltage VREF, the data receiving unit 200 can be implemented with a typical differential amplifier without the need of significantly increasing the number of TSVs.

The data receiving unit 200 receives a delay strobe pulse IOSTPD, the reference voltage VREF and the transmission data GIO_TSV to generate the second chip data GIO_S. The delay strobe pulse IOSTPD is a delayed signal of the strobe pulse IOSTP. It is preferable that an enable timing of the delay strobe pulse IOSTPD is delayed from an enable timing of the strobe pulse IOSTP by the time period necessary for the transmission data GIO_TSV to be transmitted to the data receiving unit 200 via the TSV 300. The delay strobe pulse IOSTPD can be generated by using a typical delay element configured to delay the strobe pulse IOSTP. The data receiving unit 200 may use the delay strobe pulse IOSTPD as its enable signal. Therefore, if the delay strobe pulse IOSTPD is enabled, the data receiving unit 200 is enabled to sense and amplify the voltage level difference between the transmission data GIO_TSV and the reference voltage VREF, thereby generating the second chip data GIO_S.

In the related art, in order to generate the second chip data GIO_S, the transmission data GIO_TSV needs to fully swing between the external voltage VDD level and the ground voltage VSS level. However, since, according to the embodiment of the invention, the data receiving unit 200 performing the differential amplification operation is included, the data transmission circuit 1 can generate the second chip data GIO_S more quickly than in the related art even if the data receiving unit 200 receives the transmission data GIO_TSV having a narrower swing width than that in the related art.

Figure 5:
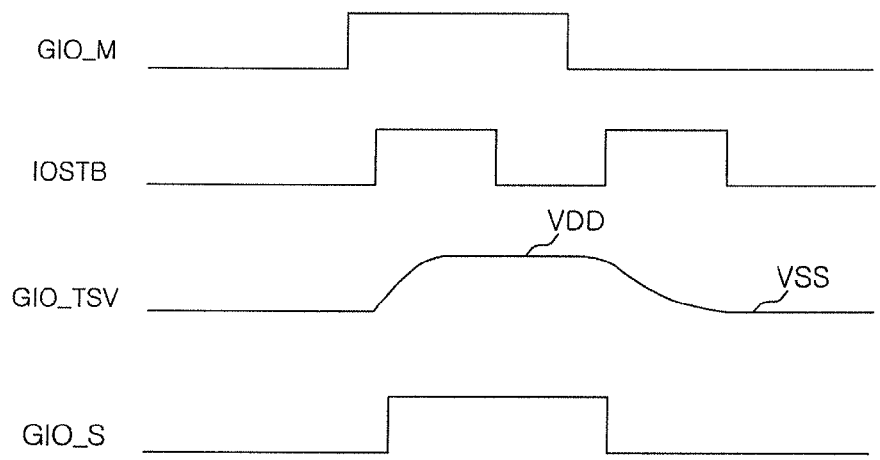
FIG. 5 is a timing diagram showing an operation of the typical data transmission circuit in FIG. 1.
Figure 6:
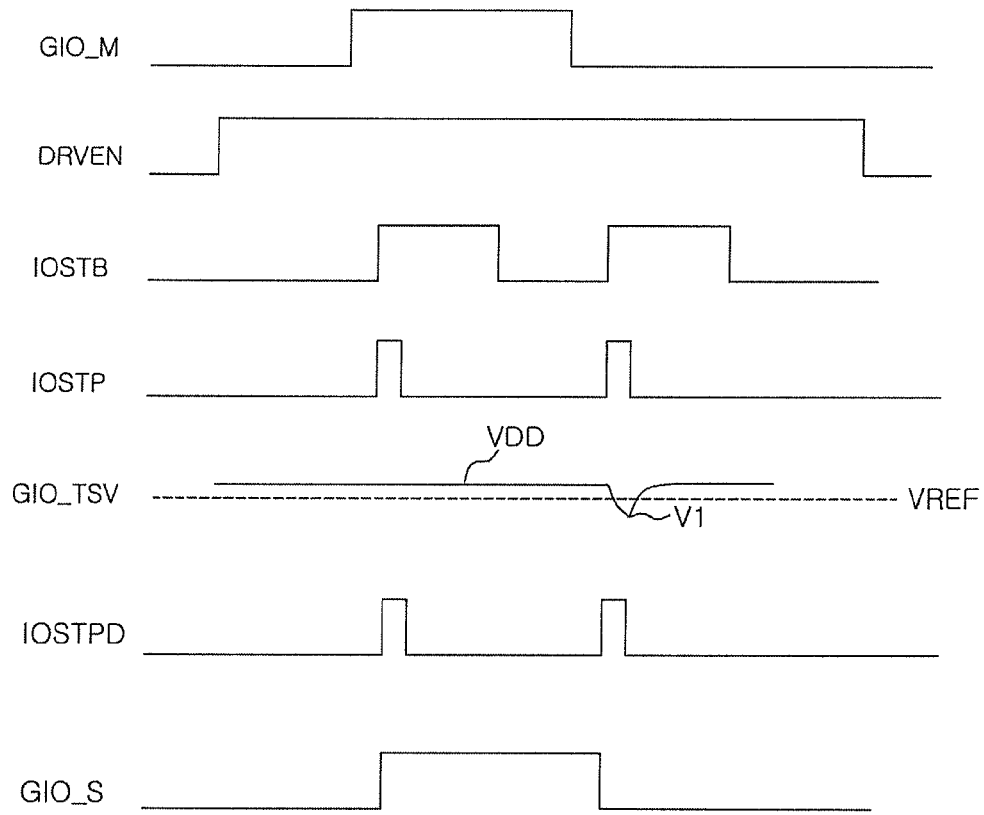
FIG. 6 is a timing diagram showing an operation of the data transmission circuit in FIG. 4 according to one embodiment of the invention.

FIG. 5 is a timing diagram showing an operation of the data transmission circuit in FIG. 1 according to the related art, whereas FIG. 6 is a timing diagram showing an operation of the data transmission circuit 1 in FIG. 4 according to the embodiment of the invention.

Firstly, an operation of the data transmission circuit 1 in FIG. 4 according to the embodiment of the invention is now be described with reference to FIG. 6. If a read/write command is inputted, the enable signal DRVEN is enabled and the strobe signal IOSTB is generated. When the enable signal DRVEN is enabled, the data transmission unit 100 drives the transmission data GIO_TSV to a logic high level. In FIG. 6, it is shown that the read/write command is inputted twice in sequence and therefore the strobe signal IOSTB is generated twice in sequence. At an enabling point of time of the strobe signal IOSTB, the pulse generating unit 500 generates the strobe pulse IOSTP which has a narrower pulse width than that of the strobe signal IOSTB. As shown in FIG. 6, since, when a first strobe pulse IOSTP is generated, the first chip data GIO_M is at a logic high level, and the transmission data GIO_TSV is maintained at a logic high level. Afterwards, when a second strobe pulse IOSTP is generated, the first chip data GIO_M is at a logic low level, and the data transmission unit 100 drives the transmission data GIO_TSV to a logic low level. At this moment, the transmission data GIO_TSV can be driven to the first voltage V1 level instead of the ground voltage VSS level, because the strobe pulse IOSTP has the narrower pulse width than that of the strobe signal IOSTB.

When the delay strobe pulse IOSTPD is generated, the data receiving unit 200 differentially amplifies the voltage level difference between the transmission data GIO_TSV and the reference voltage VREF. As shown in FIG. 6, when the first delay strobe pulse IOSTPD is generated, the data receiving unit 200 generates the second chip data GIO_S of a logic high level, because the transmission data GIO_TSV is at a logic high level. Afterwards, when the second delay strobe pulse IOSTPD is generated, the transmission data GIO_TSV is at the first voltage V1 level. Therefore, if the data receiving unit 200 receives the transmission data GIO_TSV of the first voltage V1 level, the data receiving unit 200 generates the second chip data GIO_S of a logic low level, because the first voltage V1 level is below the reference voltage VREF level.

FIG. 5 shows that the related art data transmission circuit needs much time to generate the transmission data GIO_TSV based on the first chip data GIO_M. Therefore, the pulse width of the strobe signal IOSTB should be extended causing increased current consumption of semiconductor apparatus with a decreased an operation speed. This is because the transmission data GIO_TSV having the large capacitance fully swing between the external voltage VDD level and the ground voltage VSS level, as mentioned above.

Referring back to FIG. 6, the data transmission circuit 1 according to the embodiment of the invention swings the transmission data GIO_TSV between the external voltage VDD level and the first voltage V1 level. Since it is sufficient that the first voltage V1 level is below the reference voltage VREF level (i.e., below the reference voltage VREF level by a voltage level difference enough for the data receiving unit 200 to detect the level difference between the reference voltage VREF and the first voltage V1), the pulse width of the strobe pulse IOSTP can be substantially reduced, and therefore the data transmission circuit 1 according to the embodiment of the invention can substantially reduce the current consumption of the semiconductor apparatus and improve the operation speed thereof.

Figure 7:
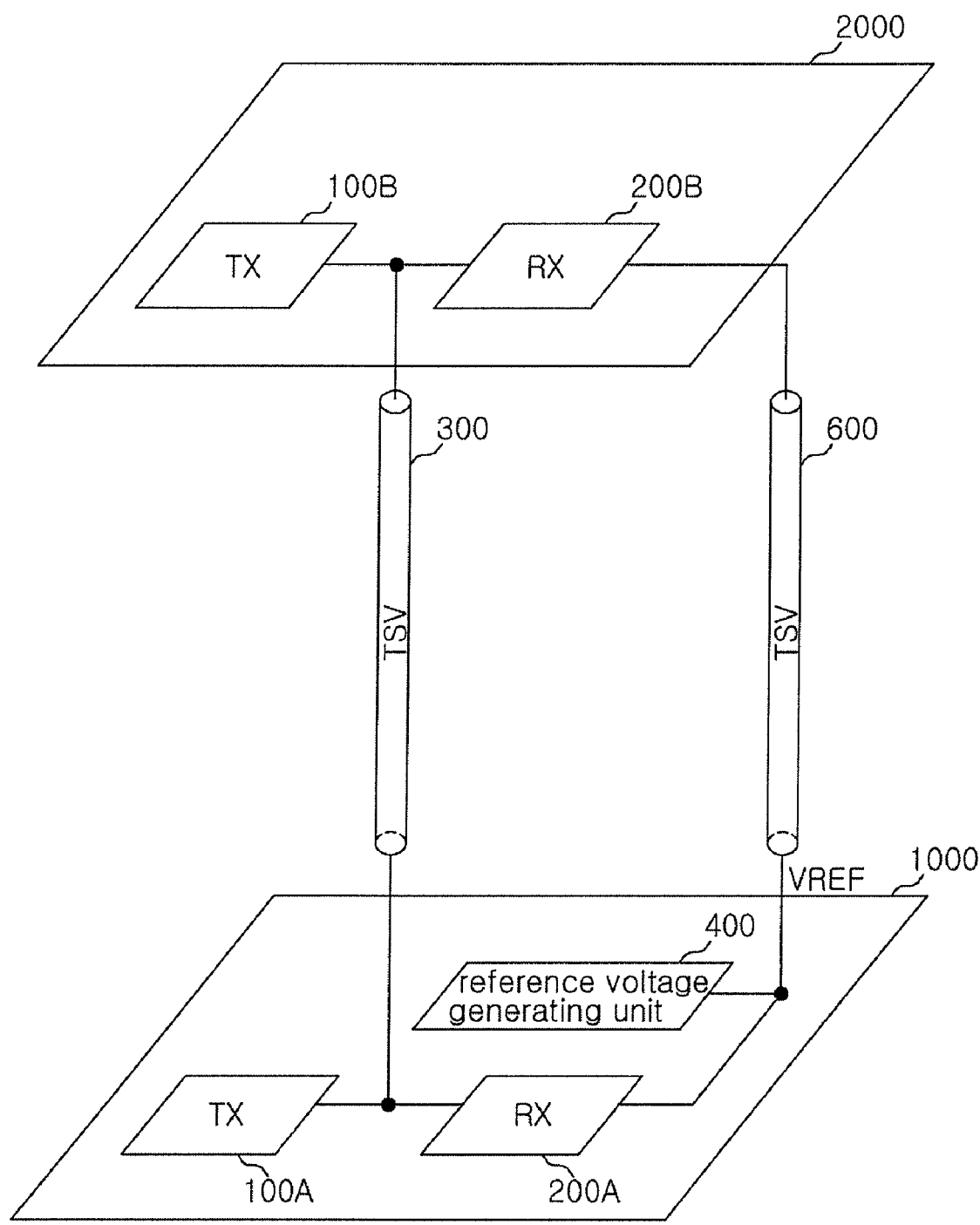
FIG. 7 is a diagram schematically showing a configuration of a semiconductor apparatus according to one embodiment of the invention.

FIG. 7 is a diagram schematically showing a configuration of a semiconductor apparatus according to the embodiment of the invention. As shown in FIG. 7, the semiconductor apparatus 2 according to the embodiment comprises a first chip 1000 and a second chip 2000. The first and second chips 1000 and 2000 are stacked one on top of the other and electrically connected with each other via a TSV 300 to constitute the semiconductor apparatus 2.

The first chip 1000 comprises a first data transmission unit 100A and a first data receiving unit 200A whereas the second chip 2000 comprises a second data transmission unit 100B and a second data receiving unit 200B. The first chip 1000 transmits first chip data to the second data receiving unit 200B via the first data transmission unit 100A and the TSV 300, and then the second chip 2000 receives the first chip data via the second data receiving unit 200B. Likewise, the second chip 2000 transmits second chip data to the first data receiving unit 200A via the second data transmission unit 100B and the TSV 300, and then the first chip 1000 receives the second chip data via the first data receiving unit 200A. In other words, the first data transmission unit 100A, the TSV 300 and the second data receiving unit 200B constitute one data transmission circuit, and the second data transmission unit 100B, the TSV 300 and the first data receiving unit 200A constitute another data transmission circuit.

In various applications, the first and second chips 1000 and 2000 can be respectively designated as a master chip and a slave chip or vice versa. For example, the first chip 1000 can be designated as the master chip and the second chip 2000 can be designated as the slave chip. In general, the 3D package semiconductor apparatus comprising the plurality of stacked chips designates and uses each of the plurality of chips as the master chip or the slave chip in the above-described manner. It is to be understood that there are many ways to designate and use each of the plurality of chips as the master chip or the slave chip. If the semiconductor apparatus designates and uses each of the plurality of chips as the master chip or the slave chip, communication between the semiconductor apparatus and the outside of the semiconductor apparatus can be conducted via the master chip. For example, in a write operation, data inputted from the outside of the semiconductor apparatus 2 is inputted to the first data transmission unit 100A of the master chip 1000 and then transmitted to the second data receiving unit 200B of the slave chip 2000 via the first data transmission unit 100A and the TSV 300. Thereafter, the slave chip 2000 can store the external data, received via the second data receiving unit 200B, in a memory bank (not shown) of the slave chip 2000. On the other hand, in a read operation, data stored in the memory bank (not shown) of the slave chip 2000 is transmitted to the first data receiving unit 200A via the second data transmission unit 100B and the TSV 300, and then the master chip 1000 receives the data stored in the memory bank of the slave chip 2000 via the first data receiving unit 200A and transmits the received data to the outside of the semiconductor apparatus 2.

In FIG. 7, a reference voltage generating unit 400 is disposed in the first chip 1000 which is designated as the master chip. However, the reference voltage generating unit 400 can be included in either or both of the first and second chips 1000 and 2000. If the reference voltage generating unit 400 is included in only one of the first and second chips 1000 and 2000, the reference voltage VREF can be transmitted to the other chip that does not include the reference voltage generating unit 400, via another TSV 600 which is provided in addition to the TSV 300 associated with the data transmission, and then the reference voltage VREF can be used in common by the first and second chips 1000 and 2000. That is, as shown in FIG. 7, the reference voltage VREF generated by the first chip 1000 can be supplied to the second chip 2000 which is designated as the slave chip via the TSV 600, and then the second data receiving unit 200B can share the reference voltage VREF with the first chip 1000.

As such, while the semiconductor apparatus 2 according to the embodiment implements the data receiving unit with the differential amplifier, the semiconductor apparatus 2 can substantially inhibit the increase of the number of TSVs and ensure the lay-out margin thereof because the semiconductor apparatus 2 performs the amplification operation by using the reference voltage VREF.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A data transmission circuit comprising:
   a data transmission unit configured to be driven between an external voltage level and a ground voltage level, generate transmission data based on first chip data and transmit the transmission data via a through silicon via (TSV), wherein the transmission data swings between the external voltage level and a first voltage level, wherein the first voltage level is above the ground voltage level; and
   a data receiving unit configured to differentially amplify the transmission data with respect to a reference voltage and generate second chip data, wherein the reference voltage level is above the first voltage level.

2. The data transmission circuit of claim 1, wherein the data transmission unit is configured to drive the transmission data to the first voltage level when the first chip data is at a logic low level, and drive the transmission data to the external voltage level when the first chip data is at a logic high level.

3. The data transmission circuit of claim 1, wherein the data transmission unit comprises:
   a control unit configured to receive an enable signal, a strobe pulse and the first chip data and generate a pull-up signal and a pull-down signal; and
   a driver configured to generate the transmission data in response to the pull-up signal and the pull-down signal, wherein the transmission data swings between the external voltage level and the first voltage level.

4. The data transmission circuit of claim 3, wherein the data transmission circuit further comprises a pulse generating unit configured to receive a strobe signal and generate the strobe pulse,
   wherein a pulse width of the strobe pulse is narrower than that of the strobe signal.

5. The data transmission circuit of claim 3, wherein the data receiving unit comprises a differential amplification unit configured to differentially amplify the transmission data with respect to the reference voltage and generate the second chip data, in response to a delay strobe pulse.

6. The data transmission circuit of claim 5, wherein the delay strobe pulse is a delayed signal of the strobe pulse and is enabled after a time period necessary for the transmission data to be transmitted via the TSV.

7. A data transmission circuit of a semiconductor apparatus comprising:
   a pulse generating unit configured to receive a strobe signal and generate a strobe pulse, wherein the strobe pulse has a narrower pulse width than that of the strobe signal;
   a data transmission unit disposed in a first chip and configured to generate transmission data based on first chip data during an enable interval of the strobe pulse and transmit the transmission data via a through silicon via (TSV), wherein the transmission data swings between an external voltage level and a first voltage level; and
   a data receiving unit disposed in a second chip and configured to differentially amplify the transmission data with respect to the reference voltage and generate second chip data.

8. The data transmission circuit of claim 7, wherein the reference voltage level is above the first voltage level, and the first voltage level is above the ground voltage level.

9. The data transmission circuit of claim 8, wherein the data transmission unit receives an enable signal, wherein the data transmission unit is configured to generate the transmission data of the external voltage level when the enable signal is enabled, and generate the transmission data of the first voltage level when the strobe pulse is enabled and the first chip data is at a logic low level.

10. The data transmission circuit of claim 7, wherein the data transmission unit comprises:
    a control unit configured to receive an enable signal, the strobe pulse and the first chip data and generate a pull-up signal and a pull-down signal; and
    a driver configured to generate the transmission data in response to the pull-up signal and the pull-down signal, wherein the transmission data swings between the external voltage level and the first voltage level.

11. The data transmission circuit of claim 10, wherein the data receiving unit comprises a differential amplification unit configured to differentially amplify the transmission data with respect to the reference voltage and generate the second chip data, in response to a delay strobe pulse.

12. The data transmission circuit of claim 11, wherein the delay strobe pulse is a delayed signal of the strobe pulse and is enabled after a time period necessary for the transmission data to be transmitted via the TSV.

13. The data transmission circuit of claim 7, wherein the data transmission circuit further comprises a reference voltage generating unit disposed in the second chip and configured to generate the reference voltage,
    wherein the reference voltage is supplied to the first chip via a TSV, and the reference voltage is shared by the first and second chips.

14. A semiconductor apparatus having a master chip and a plurality of slave chips which are stacked and electrically connected with each other via a through silicon via (TSV), comprising:
    a first data transmission circuit configured to receive master chip data via the TSV and differentially amplify the received data with respect to a reference voltage to generate slave chip data, wherein the master chip data are transformed to master transmission data having a smaller swing width than a swing width between an external voltage level and a ground voltage level, which are source voltage levels of the first data transmission circuit, wherein the master transmission data is transmitted via the TSV; and a second data transmission circuit configured to receive the slave chip data via the TSV and differentially amplify the slave chip data received with respect to the reference voltage to generate the master chip data.

15. The semiconductor apparatus of claim 14, wherein the master transmission data swings between the external voltage level and a first voltage level.

16. The semiconductor apparatus of claim 15, wherein the slave chip data is transformed to slave transmission data having a smaller swing width than a swing width between the external voltage level and the ground voltage level, which are source voltage levels of the second data transmission circuit, and the slave transmission data is transmitted via the TSV, and wherein the slave transmission data swings between the external voltage level and the first voltage level.

17. The semiconductor apparatus of claim 16, wherein the reference voltage level is above the first voltage level, and the first voltage level is above the ground voltage level.

18. The semiconductor apparatus of claim 14, wherein the semiconductor apparatus further comprises a reference voltage generating unit disposed in at least one of the master chip and the plurality of slave chips and configured to generate the reference voltage, wherein the reference voltage is supplied to the other chips via a TSV, and the reference voltage is shared by the master chip and the plurality of slave chips.

\* \* \* \* \*